(12) United States Patent
Kakoiyama et al.

(10) Patent No.: US 12,074,185 B2
(45) Date of Patent: Aug. 27, 2024

(54) SEMICONDUCTOR DEVICE

(71) Applicant: SONY SEMICONDUCTOR SOLUTIONS CORPORATION, Kanagawa (JP)

(72) Inventors: Naoki Kakoiyama, Kanagawa (JP); Shuichi Oka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 355 days.

(21) Appl. No.: 17/434,937

(22) PCT Filed: Jan. 9, 2020

(86) PCT No.: PCT/JP2020/000408
§ 371 (c)(1),
(2) Date: Aug. 30, 2021

(87) PCT Pub. No.: WO2020/183881
PCT Pub. Date: Sep. 17, 2020

(65) Prior Publication Data
US 2022/0149099 A1 May 12, 2022

(30) Foreign Application Priority Data
Mar. 12, 2019 (JP) ................ 2019-045052

(51) Int. Cl.
*H01L 27/146* (2006.01)
*H01L 23/13* (2006.01)
(Continued)

(52) U.S. Cl.
CPC ........ *H01L 27/14627* (2013.01); *H01L 23/13* (2013.01); *H01L 23/15* (2013.01); *H01L 23/367* (2013.01); *H01L 27/14623* (2013.01)

(58) Field of Classification Search
CPC ... H01L 27/14627; H01L 23/13; H01L 23/15; H01L 23/367; H01L 27/14623; H01L 27/14625; H01L 27/14618; H04N 25/70
See application file for complete search history.

(56) References Cited

U.S. PATENT DOCUMENTS

2004/0217451 A1  11/2004  Lee et al.
2015/0021081 A1*  1/2015  Mitarai ............... H05K 3/4697
                                                                29/846
(Continued)

FOREIGN PATENT DOCUMENTS

CN  105187697 A  12/2015
DE  10343300 A1  6/2004
(Continued)

OTHER PUBLICATIONS

International Search Report and Written Opinion of PCT Application No. PCT/JP2020/000408, issued on Mar. 24, 2020, 11 pages of ISRWO.

*Primary Examiner* — J. E. Schoenholtz
(74) *Attorney, Agent, or Firm* — CHIP LAW GROUP

(57) ABSTRACT

To eliminate influence caused by a difference in coefficient of linear expansion between a substrate and another material, and to secure a stable mounting structure of a semiconductor element. A semiconductor device includes a glass substrate and the semiconductor element. The glass substrate includes a through hole that penetrates front and back surfaces. Furthermore, the glass substrate includes a stepped portion on an outer periphery of the through hole. The semiconductor element is joined to the stepped portion of the glass substrate. For example, in a case where an imaging element is used as the semiconductor element, image quality of an image obtained by imaging is improved by preventing defocus of light incident on the imaging element.

17 Claims, 12 Drawing Sheets

(51) Int. Cl.
*H01L 23/15* (2006.01)
*H01L 23/367* (2006.01)

(56) References Cited

U.S. PATENT DOCUMENTS

2017/0280558 A1* 9/2017 Ohara .................... G03B 17/55
2017/0301558 A1* 10/2017 Mitarai ................. H05K 1/185

FOREIGN PATENT DOCUMENTS

| | | |
|---|---|---|
| EP | 3334145 A1 | 6/2018 |
| GB | 2396963 A | 7/2004 |
| JP | 2004-165671 A | 6/2004 |
| JP | 2006253936 A | 9/2006 |
| JP | 2013-085095 A | 5/2013 |
| JP | 2014-216394 A | 11/2014 |
| JP | 2015-015529 A | 1/2015 |
| JP | 2015038962 A | 2/2015 |
| JP | 2017-040723 A | 2/2017 |
| JP | 2018-532352 A | 11/2018 |
| TW | 201712424 A | 4/2017 |
| WO | WO-2013081156 A | 6/2013 |
| WO | WO-2016031332 A1 | 3/2016 |
| WO | 2017/020751 A1 | 2/2017 |
| WO | 2019/044172 A1 | 3/2019 |

* cited by examiner f g h i j k l

SEMICONDUCTOR DEVICE

CROSS REFERENCE TO RELATED APPLICATIONS

This application is a U.S. National Phase of International Patent Application No. PCT/JP2020/000408 filed on Jan. 9, 2020, which claims priority benefit of Japanese Patent Application No. JP 2019-045052 filed in the Japan Patent Office on Mar. 12, 2019. Each of the above-referenced applications is hereby incorporated herein by reference in its entirety.

TECHNICAL FIELD

The present technology relates to a semiconductor device. More specifically, it relates to a semiconductor device in which a semiconductor element is joined to a substrate and a heat dissipation member is provided.

BACKGROUND ART

Imaging elements such as charge coupled device (CCD) and complementary metal oxide semiconductor (CMOS) image sensors, and the like, to which semiconductor microfabrication technology is applied, are widely used in digital cameras, mobile phones, and the like. These imaging elements are mounted on electronic devices as a camera module by mounting a lens structure. In order to reduce size and thickness of this camera module, for example, an imaging device has been proposed in which a rectangular opening hole penetrating the front and back of a package member is formed and an imaging element is provided on one end side of the opening hole (For example, see Patent Document 1.).

CITATION LIST

Patent Document

Patent Document 1: Japanese Patent Application Laid-Open No. 2013-085095

SUMMARY OF THE INVENTION

Problems to be Solved by the Invention

In the above-mentioned conventional technology, the package member is formed with the opening hole penetrating the front and back to reduce size and thickness of the module. However, in this conventional technology, it is premised that the package member includes a resin molded product, and there is a possibility that a warp occurs due to a difference in coefficient of linear expansion between the package member and the imaging measure. In particular, in a case where the imaging element is mounted, if a warp or the like occurs and flatness cannot be ensured, there is a possibility that light incident on the imaging element is out of focus and image quality of an image obtained by imaging is deteriorated.

The present technology has been made in view of such a situation, and an object thereof is to eliminate influence caused by a difference in coefficient of linear expansion between a substrate and another material and to secure a stable mounting structure of a semiconductor element.

Solutions to Problems

The present technology has been made to solve the above-mentioned problems, and a first aspect thereof is a semiconductor device including: a glass substrate having a through hole penetrating front and back surfaces and a stepped portion on an outer periphery of the through hole; and a semiconductor element joined to the stepped portion. Therefore, there is an effect of reducing a difference in coefficient of linear expansion between the glass substrate and the semiconductor element to suppress a warp or tilt caused by the difference in coefficient of linear expansion.

Furthermore, in this first aspect, the glass substrate may include a wiring layer on its surface. A use mode of the glass substrate is assumed. Then, the semiconductor element may be disposed at a position where its surface is substantially on the same plane as the wiring layer. Therefore, there is an effect of enclosing the semiconductor element and the wiring layer in the glass substrate to reduce height of the semiconductor device.

Furthermore, in this first aspect, the stepped portion may include a first stepped portion provided on the outer periphery of the through hole and a second stepped portion provided on an outer periphery of the first stepped portion, and the semiconductor element may be joined to the first stepped portion. Therefore, there is an effect of keeping a mounting position of the semiconductor element low.

Furthermore, in this first aspect, the glass substrate may include a wiring layer on each of its surface and the second stepped portion. A use mode of the glass substrate is assumed. Then, the semiconductor element may be disposed at a position where its surface is substantially on the same plane as the wiring layer on a bottom surface of the second stepped portion. Therefore, there is an effect of enclosing the semiconductor element and the wiring layer in the glass substrate to reduce height of the semiconductor device.

Furthermore, in this first aspect, it is assumed that the semiconductor element is, for example, an imaging element. At this time, the semiconductor element may be joined to the glass substrate on a surface on a side opposite to a light receiving portion of the imaging element. Therefore, there is an effect of securing a junction area between the semiconductor element and the glass substrate. On the other hand, the semiconductor element may be joined to the glass substrate on the surface on the side opposite to the light receiving portion of the imaging element. Therefore, there is an effect of securing a heat dissipation area.

Furthermore, in this first aspect, a heat dissipation member to be joined to the semiconductor element may be further provided. Therefore, there is an effect of improving heat dissipation. In this case, the heat dissipation member may be further joined to the glass substrate. Therefore, there is an effect of further improving the heat dissipation. At this time, a flexible heat dissipation sheet may be used for the heat dissipation member. Furthermore, a clad material may be used for the heat dissipation member. Therefore, there is an effect of reducing a difference in coefficient of linear expansion from silicon to suppress a warp or tilt caused by the difference in coefficient of linear expansion.

Furthermore, in this first aspect, in the glass substrate, a side surface of an opening in the through hole may be tapered. When wet etching is used in a manufacturing process, it usually has such a tapered shape. On the other hand, in the glass substrate, a side surface of an opening in the through hole may be substantially perpendicular to the surface of the glass substrate. For that purpose, combination with laser irradiation can be considered. Therefore, there is an effect of reducing size in a plane direction.

Furthermore, in this first aspect, the glass substrate may include at least two base materials joined to each other.

Therefore, there is an effect of processing with high flatness to form a side surface of the stepped portion vertically.

Furthermore, in this first aspect, a resin having a light shielding property that covers the side surface of the opening in the through hole of the glass substrate may be further provided. Therefore, in a case where the imaging element is mounted on the glass substrate, an effect of avoiding an influence of external light on the imaging element on the glass substrate is brought about.

Furthermore, in this first aspect, a lens structure in which a plurality of lenses is laminated may be further provided, and light focused by the plurality of lenses may be incident on the imaging element. Therefore, there is an effect of integrating an optical system into the semiconductor device.

Furthermore, in this first aspect, the glass substrate may include a plurality of the through holes, and a plurality of the semiconductor elements joined to the stepped portion of each of the plurality of through holes may be provided. Therefore, there is an effect of realizing a compound-eye imaging element.

MODE FOR CARRYING OUT THE INVENTION

Hereinafter, modes for carrying out the present technology (hereinafter referred to as embodiments) will be described. The explanation will be given in the following order.

1. First embodiment (example of forming a through hole in a glass substrate)
2. Second embodiment (example of providing a stepped portion having two steps)
3. Third embodiment (example of joining to an outer periphery of a light receiving surface)
4. Fourth embodiment (example of processing a side surface vertically)
5. Fifth embodiment (example of bonding two base materials to form a stepped portion)
6. Sixth embodiment (example of mounting two imaging elements)

1. FIRST EMBODIMENT

Mounting Structure

Figure 1:
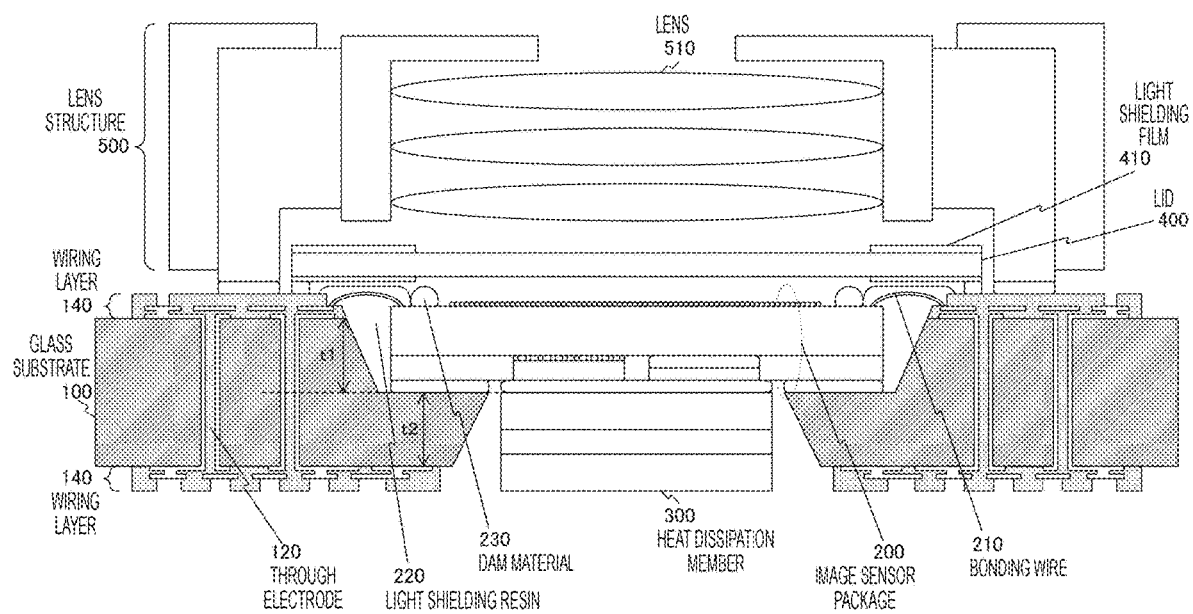
FIG. 1 is a cross-sectional view showing an example of a semiconductor device according to a first embodiment of the present technology.

FIG. 1 is a cross-sectional view showing an example of a semiconductor device according to a first embodiment of the present technology.

This semiconductor device has a package structure in which an image sensor package 200 is joined to a through hole of a glass substrate 100, and a heat dissipation member 300 is joined to a surface opposite to a light receiving surface of the image sensor package 200. A lid 400 and a lens structure 500 are provided on the light receiving surface side of the image sensor package 200.

The glass substrate 100 is penetrated from front and back main surfaces by counterbore processing having different opening areas to form a stepped surface. The image sensor package 200 is in contact with and joined to this stepped surface of the glass substrate 100. Furthermore, the heat dissipation member 300 is joined to the surface opposite to the light receiving surface of the image sensor package 200 exposed from the through hole. Note that the image sensor package 200 is an example of a semiconductor element described in the claims.

The glass substrate 100 is a substrate using glass as a material. As this glass substrate 100, a material having a coefficient of thermal expansion (CTE) close to that of silicon (Si) is used. Specifically, non-alkali glass such as Eagle-XG, EN-A1, and the like, and borosilicate glass such as PYREX (registered trademark) and the like can be used. Note that the coefficient of linear expansion of silicon is 3 ppm/° C., and the coefficient of linear expansion of the glass substrate 100 using the above-mentioned material is about 3 to 4 ppm/° C.

The heat dissipation member 300 dissipates heat generated in the glass substrate 100. As this heat dissipation member 300, a clad material such as cupper-inver-cupper (CIC), Cu—Mo—Cu (CMC), and the like are used. By using this clad material, a difference in coefficient of linear expansion from silicon can be reduced. Here, a coefficient of linear expansion of copper (Cu) is 16 ppm/° C., a coefficient of linear expansion of inner (Inver) is 1.2 ppm/° C., and a coefficient of linear expansion of molybdenum (Mo) is 5.1 ppm/° C. A coefficient of linear expansion as the clad material is about 8 to 13 ppm/° C. Therefore, it can be seen that it is more advantageous than using a copper plate (coefficient of linear expansion of 16 ppm/° C.) or the like for heat dissipation.

In other words, a difference in coefficient of linear expansion between the glass substrate 100 and the image sensor package 200 and that between the heat dissipation member 300 and the image sensor package 200 are reduced, so that a warp or tilt caused by the difference in coefficient of linear expansion can be suppressed.

The through hole is formed by connecting counterbores with different opening areas from upper and lower surfaces of the glass substrate 100, and a stepped portion is formed around the through hole. In this example, a side surface of an opening of the stepped portion is formed in a tapered shape. The image sensor package 200 including an imaging element, a processing circuit, and the like is formed by including, for example, a wafer level package (WLP), is then separated into individual pieces, and is brought into contact with and mounted on the stepped portion of the glass substrate 100 on the surface opposite to a light receiving portion.

In the glass counterbore processing, flatness of a bottom surface is several pm or less, and height variation between a glass surface and the stepped portion is as small as ten and several pm or less, so that a warp or tilt due to initial shape variation can be reduced.

A pad is formed on the light receiving surface of the image sensor package 200, and is bonded to a pad formed as a wiring layer 140 on the surface of the glass substrate 100 by a bonding wire 210.

A dam material 230 is formed on the light receiving surface side of the image sensor package 200 so as to surround the light receiving portion, and is potted by a light shielding resin 220 from an outer periphery of the dam material 230 to a counterbore side surface. Note that the light shielding resin 220 is an example of a light shielding resin 220 described in the claims.

The surface of the glass substrate 100 is covered with the lid 400 to protect the image sensor package 200. A light shielding film 410 is patterned on the lid 400 to limit light incident on the light receiving portion.

Moreover, the surface of the glass substrate 100 is covered with the lens structure 500 so as to cover the lid 400, and light is collected. The light collected by the lens structure 500 is incident on the light receiving surface of the image sensor package 200.

In the drawing, t1 is a counterbore depth on a front surface side of the glass substrate 100, and t2 is a counterbore depth on a back surface of the glass substrate 100. In other words, t1 represents distance from the front surface of the glass substrate 100 to the stepped portion. Here, it is preferable that t1 is substantially the same as thickness of the image sensor package 200. Therefore, height of the pad on the glass substrate 100 side and that of the pad on the image sensor package 200 side are substantially the same, loop height of the bonding wire 210 can be lowered, and interference between the bonding wire 210 and the lid 400 can be reduced.

As described above, according to the first embodiment of the present technology, the image sensor package 200 is joined to the stepped portion provided on an outer periphery of the through hole of the glass substrate 100, so that a warp or tilt of a reference surface and the light receiving surface caused by the difference in coefficient of linear expansion can be reduced, and a stable mounting structure can be ensured. Furthermore, since the mounting component can be included in the glass substrate 100, height of the semiconductor device can be reduced.

First Modified Example

Figure 2:
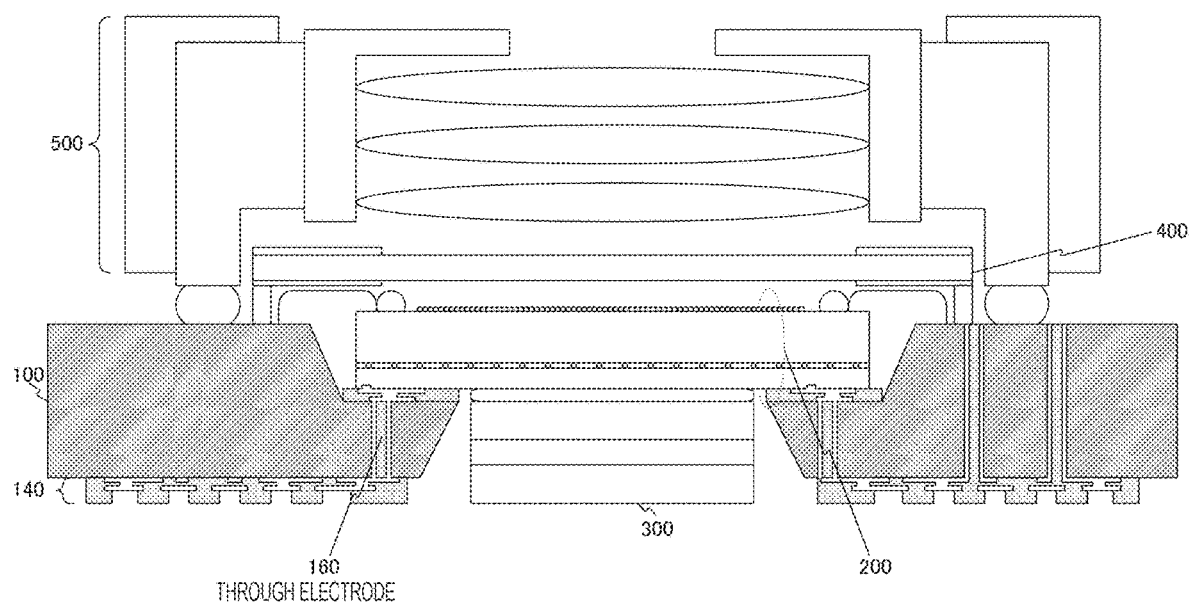
FIG. 2 is a cross-sectional view showing a first modified example of the semiconductor device according to the first embodiment of the present technology.

FIG. 2 is a cross-sectional view showing a first modified example of the semiconductor device according to the first embodiment of the present technology.

In the first embodiment described above, the pad on the light receiving surface of the image sensor package 200 and the wiring layer 140 on the surface of the glass substrate 100 are electrically connected by the bonding wire 210. On the other hand, in this first modified example, a through electrode 160 that connects the stepped portion of the glass substrate 100 and the back surface of the glass substrate 100 is provided, and this through electrode 160 is used for electrical connection. Therefore, it is not necessary to take out an electrode from a back surface of the image sensor package 200 to form the bonding wire 210 on the light receiving surface side, so that interference between the bonding wire 210 and the lid 400 can be eliminated.

Second Modified Example

Figure 3:
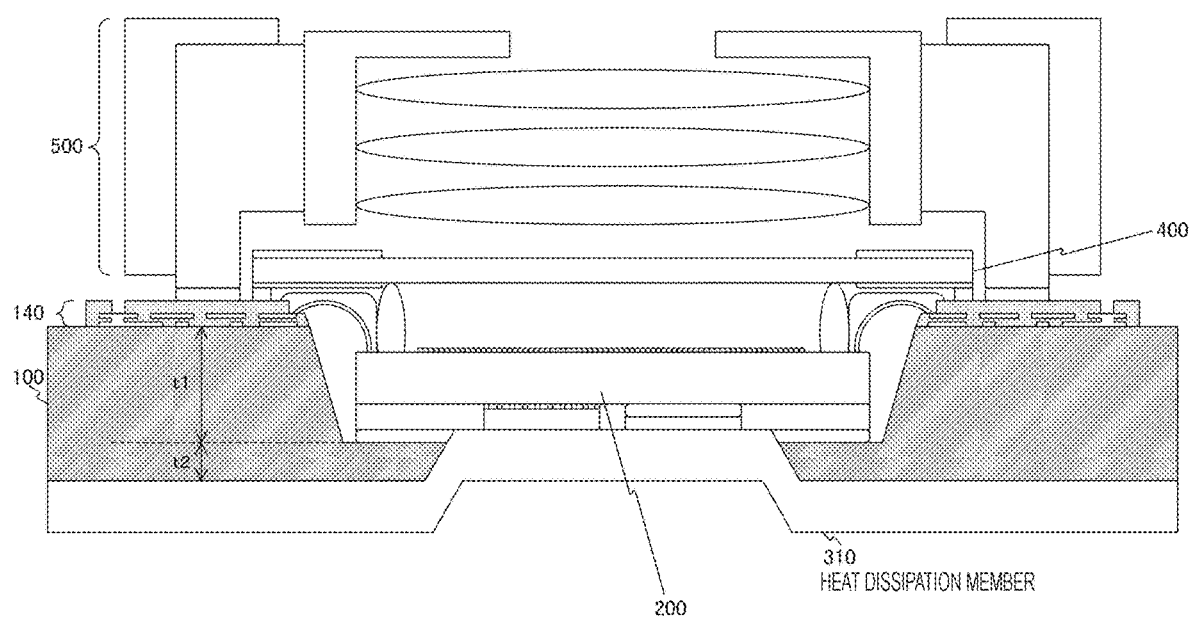
FIG. 3 is a cross-sectional view showing a second modified example of the semiconductor device according to the first embodiment of the present technology.

FIG. 3 is a cross-sectional view showing a second modified example of the semiconductor device according to the first embodiment of the present technology.

In the first embodiment described above, the clad material is used as the heat dissipation member 300. On the other hand, in this second modified example, a graphite sheet, which is a flexible heat dissipation sheet, is used as a heat dissipation member 310. Since the heat dissipation member 310 has flexibility, it can be joined by following a counterbore shape on the back surface side of the glass substrate 100, and can continuously cover the back surface of the image sensor package 200 and the back surface of the glass substrate 100. Therefore, heat generated from the image sensor package 200 can be spread over the entire back surface of the glass substrate 100, and heat dissipation can be improved.

Here, the smaller the counterbore depth t2 on the back surface of the glass substrate 100, the smaller the step, so that the graphite sheet as the heat dissipation member 310 can easily follow. However, if t2 is small, rigidity of the stepped portion of the glass substrate 100 to which the image sensor package 200 is joined becomes small, so that cracks are likely to occur. Therefore, it is necessary to set t2 by balancing the rigidity of the stepped portion of the glass substrate 100 and step followability of the graphite sheet as the heat dissipation member 310.

2. SECOND EMBODIMENT

Mounting Structure

Figure 4:
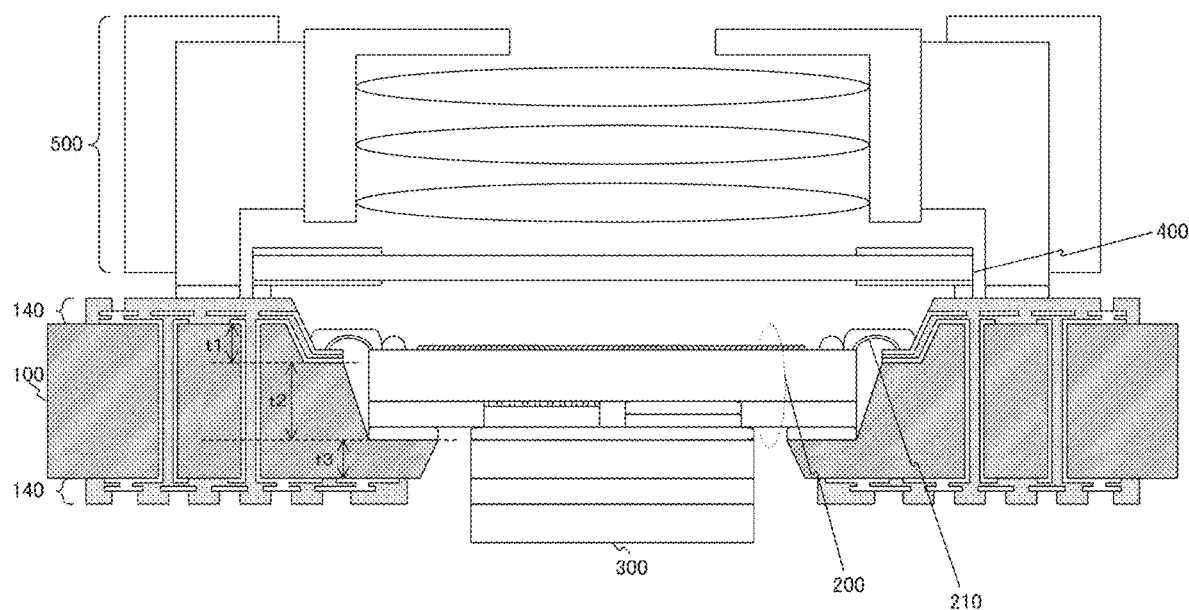
FIG. 4 is a cross-sectional view showing an example of a semiconductor device according to a second embodiment of the present technology.

FIG. 4 is a cross-sectional view showing an example of a semiconductor device according to a second embodiment of the present technology.

In this second embodiment, the stepped portion of the glass substrate 100 has two steps. In this structure, the image sensor package 200 is brought into contact with and joined to a first step of the stepped portion, which is the deepest when viewed from the surface of the glass substrate 100. Furthermore, it is electrically connected to a second step of the stepped portion by the bonding wire 210.

Here, it is preferable that a counterbore depth t1 on the front surface side of the glass substrate 100 is equal to or greater than loop height of the bonding wire 210. Therefore, interference between the bonding wire 210 and the lid 400 can be avoided in a manner similar to the first embodiment described above.

Furthermore, it is preferable that a counterbore depth t2 on the back surface of the glass substrate 100 is substantially the same as the thickness of the image sensor package 200. Therefore, a pad surface on the glass substrate 100 side and a pad surface on the image sensor package 200 side have the same height, and the loop height of the bonding wire 210 can be lowered.

Manufacturing Method

FIGS. 5A, 5B, 5C, 5D, and 5E are diagrams showing an example of a method for manufacturing the semiconductor device according to the second embodiment of the present technology.

Figure 5:
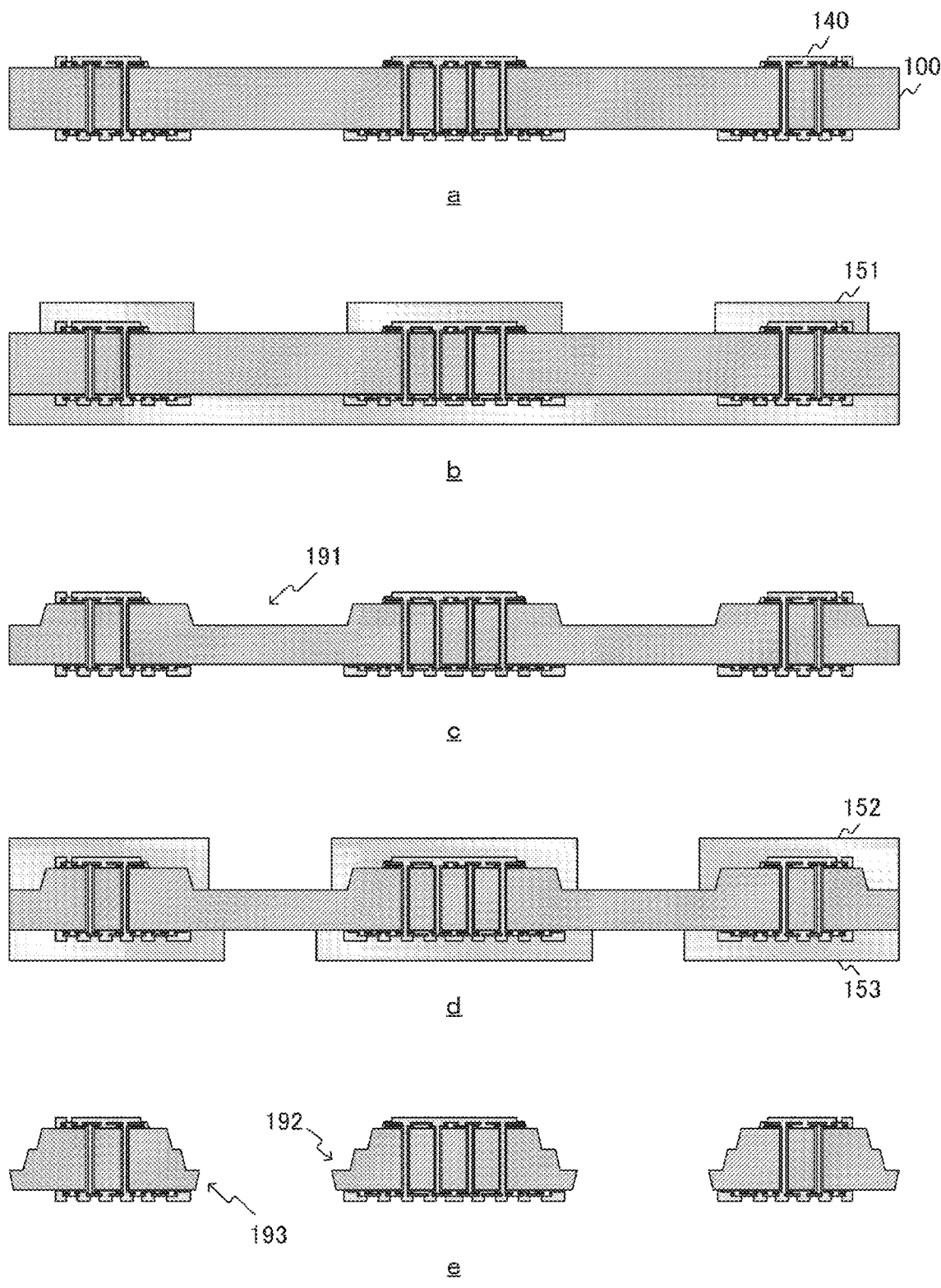
FIGS. 5A, 5B, 5C, 5D, and 5E are diagrams showing an example of a method for manufacturing the semiconductor device according to the second embodiment of the present technology.

First, the glass substrate 100 is prepared as a base material, Fig. 5A through via 110 is formed, and after plating is applied to the inside of the through via 110, metal is embedded inside to form a through electrode 120. Then, as shown in Fig. 5A in the drawing, the wiring layers 140 are formed on both surfaces of the glass substrate 100.

Next, as shown in Fig. 5B in the drawing, a resist 151 is patterned to protect a portion of the glass substrate 100 other than a position where the first step of the stepped portion is formed, and an opened portion is wet-etched. Therefore, as shown in Fig. 5C in the drawing, a first step of a stepped portion 191 is formed. Note that the stepped portion 191 is an example of a second stepped portion described in the claims.

Next, as shown in Fig. 5D in the drawing, resists 152 and 153 are patterned to protect a portion of the glass substrate 100 other than positions where the second step of the stepped portion and the through hole are formed, and an opened portion is wet-etched. Therefore, as shown in Fig. 5E in the drawing, a second step of a stepped portion 192 and a through hole 193 are formed. Note that the stepped portion 192 is an example of a first stepped portion described in the claims.

Note that, as such an etching process, for example, it is considered that etching processing is easily performed by injecting an etching solution while transporting the glass substrate 100 in a horizontal direction.

As described above, in the second embodiment of the present technology, the stepped portion of the glass substrate 100 has two steps, the image sensor package 200 is joined to the deep stepped portion, and the bonding wire 210 is formed in the shallow stepped portion. Therefore, interference between the bonding wire 210 and the lid 400 can be avoided.

3. THIRD EMBODIMENT

Mounting Structure

Figure 6:
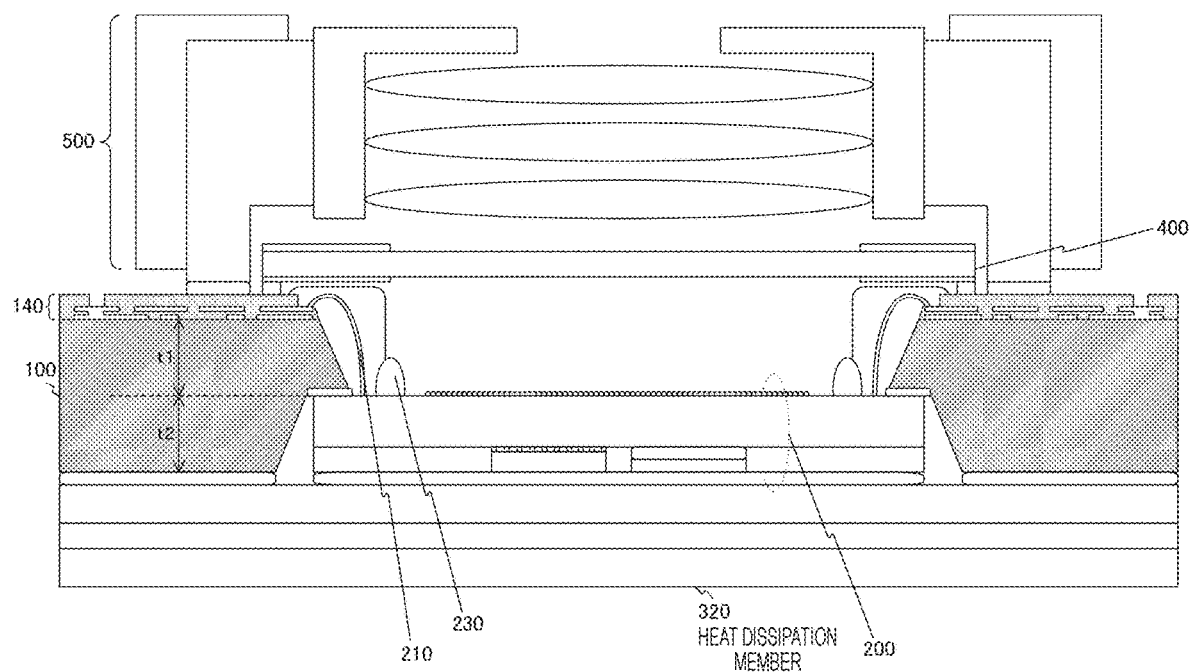
FIG. 6 is a cross-sectional view showing an example of a semiconductor device according to a third embodiment of the present technology.

FIG. 6 is a cross-sectional view showing an example of a semiconductor device according to a third embodiment of the present technology.

In the first embodiment described above, the image sensor package 200 is joined to the glass substrate 100 on the surface on the side opposite to the light receiving portion. However, in the third embodiment, the image sensor package 200 is joined to the glass substrate 100 on the light receiving surface. Therefore, a margin is provided on an outer periphery of the light receiving portion on the light receiving surface of the image sensor package 200, and the margin portion and the stepped portion are joined.

The dam material 230 is formed on the outer periphery of the light receiving portion. A pad for electrical connection is formed between the dam material 230 and the margin portion, and is electrically connected with a pad formed on the surface of the glass substrate 100 by the bonding wire 210.

The counterbore depth t2 on the back surface of the glass substrate 100 and the thickness of the image sensor package 200 are substantially the same, and the back surface of the glass substrate 100 and the back surface of the image sensor package 200 are located on substantially the same plane. A heat dissipation member 320 is joined to both the back surface of the glass substrate 100 and the back surface of the image sensor package 200. As a result, an area of the heat dissipation member 320 can be widely secured, so that heat dissipation can be improved. Furthermore, since this structure can secure a long distance from the surface of the glass substrate 100 to the light receiving surface, a focal length of the lens can be increased.

As described above, according to the third embodiment of the present technology, the back surface of the glass substrate 100 and the back surface of the image sensor package 200 are disposed on substantially the same plane, so that the area of the heat dissipation member 320 can be widely secured, and the heat dissipation can be improved.

4. FOURTH EMBODIMENT

Mounting Structure

Figure 7:
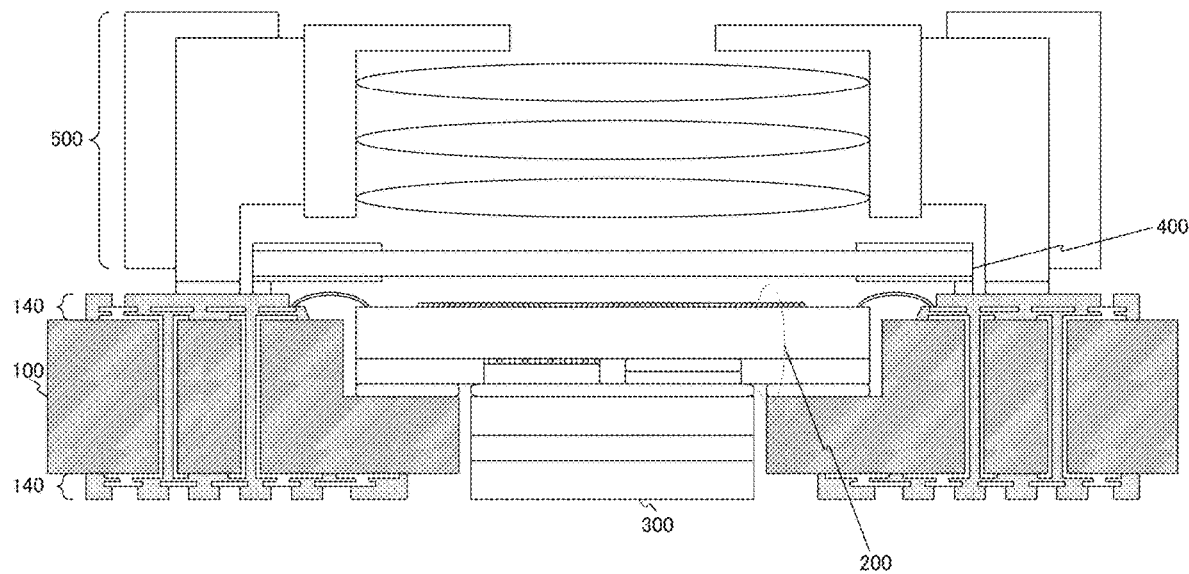
FIG. 7 is a cross-sectional view showing an example of a semiconductor device according to a fourth embodiment of the present technology.

FIG. 7 is a cross-sectional view showing an example of a semiconductor device according to a fourth embodiment of the present technology.

Since wet etching is premised in the first embodiment described above, the side surface of the opening of the stepped portion is formed in a tapered shape. On the other hand, in the fourth embodiment, the glass substrate 100 is processed vertically by using laser irradiation and wet processing in a process of counterbore processing thereof.

In other words, vertical processing can be realized by modifying glass in a thickness direction by irradiating it with a laser and performing wet etching starting from a modified portion. In this case, since the wet etching can be completed in a short time, a taper can be suppressed and miniaturization in a plane direction can be realized.

As described above, according to the fourth embodiment of the present technology, the laser irradiation and the wet processing are used in the process of counterbore processing of the glass substrate 100, so that the side surface of the stepped portion is prevented from becoming tapered, and miniaturization in the plane direction can be realized.

5. FIFTH EMBODIMENT

Mounting Structure

Figure 8:
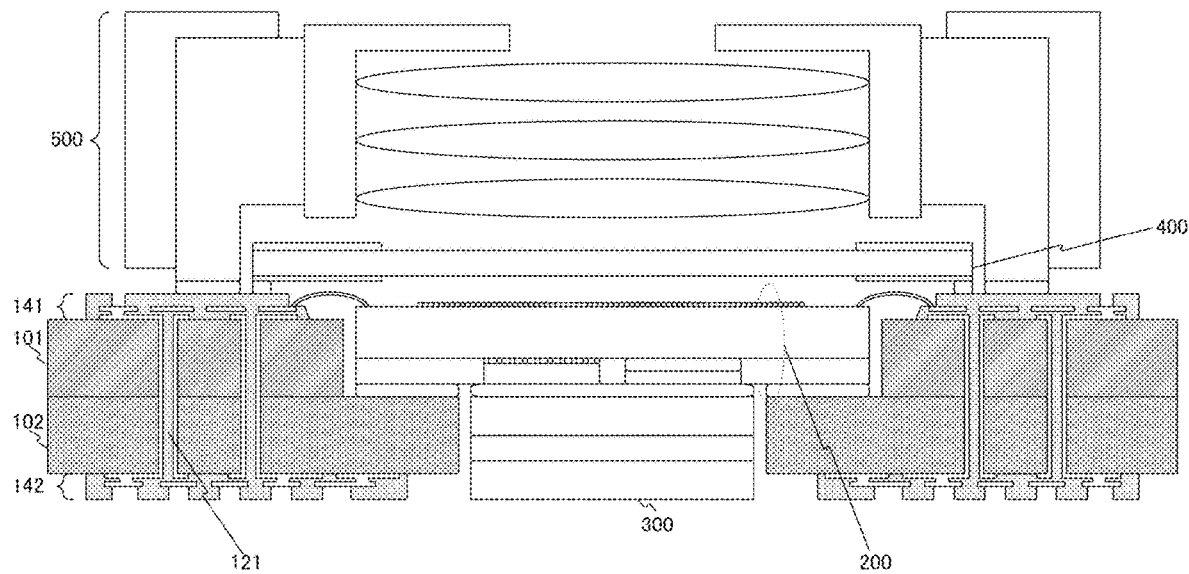
FIG. 8 is a cross-sectional view showing an example of a semiconductor device according to a fifth embodiment of the present technology.

FIG. 8 is a cross-sectional view showing an example of a semiconductor device according to a fifth embodiment of the present technology.

In the first embodiment described above, it is assumed that the through hole is formed by performing the counterbore processing on one glass substrate 100. On the other hand, in this fifth embodiment, two or more glass substrates 101 and 102 having different sizes of through holes are bonded together to form a stepped portion.

In a process of forming the through hole, wet processing, laser irradiation and wet processing, machining, sandblasting, and the like can be used. In particular, since a plate material can be polished, it can be manufactured with high flatness. Therefore, a side surface of the stepped portion can be formed vertically in a manner similar to the fourth embodiment described above. Therefore, a taper is suppressed, so that miniaturization in a plane direction can be realized.

As described above, according to the fifth embodiment of the present technology, two or more glass substrates 101 and 102 having different sizes of through holes are bonded, so that the side surface of the stepped portion is prevented from becoming tapered, and miniaturization in the plane direction can be realized.

6. SIXTH EMBODIMENT

Mounting Structure

Figure 9:
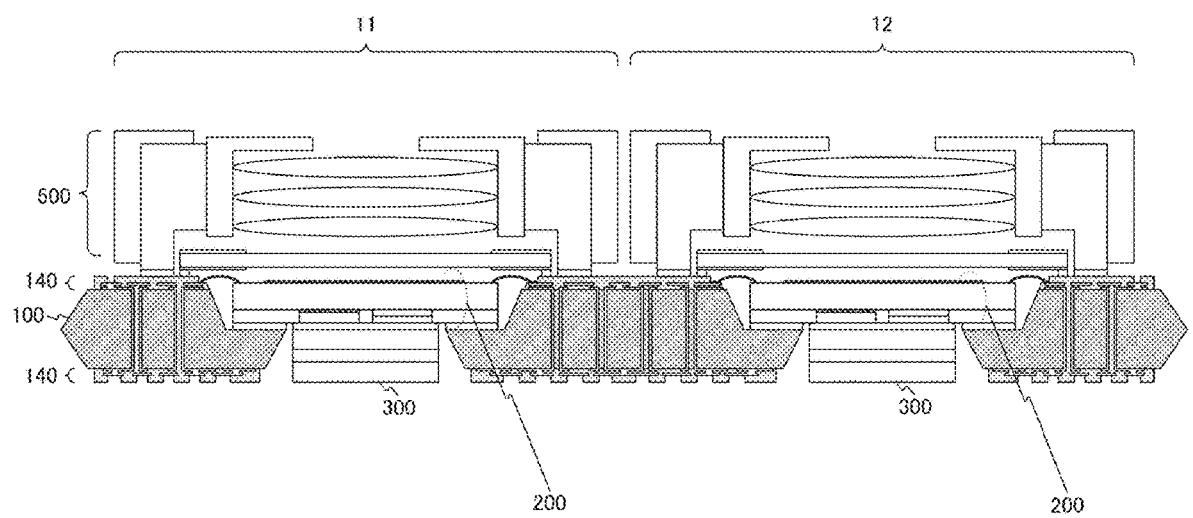
FIG. 9 is a cross-sectional view showing an example of a semiconductor device according to a sixth embodiment of the present technology.

FIG. 9 is a cross-sectional view showing an example of a semiconductor device according to a sixth embodiment of the present technology.

In the first embodiment described above, it is assumed that one image sensor package 200 is mounted. On the other hand, in this sixth embodiment, two or more image sensor packages 200 are mounted. Therefore, a compound eye of an imaging device is designed. In other words, a mounting structure in which a plurality of imaging devices 11 and 12 is integrated is realized.

Even if a mounting area becomes large due to this compound eye, an initial warp or tilt and a warp or tilt due to a difference in coefficient of linear expansion can be reduced by using the glass substrate 100.

Manufacturing Method

FIGS. 10A, 10B, 10C, 10D, 10E, 11A, 11B, 11C, 11D, 12A, 12B, and 12C are diagrams showing an example of a method for manufacturing the semiconductor device according to the sixth embodiment of the present technology.

Figure 10:
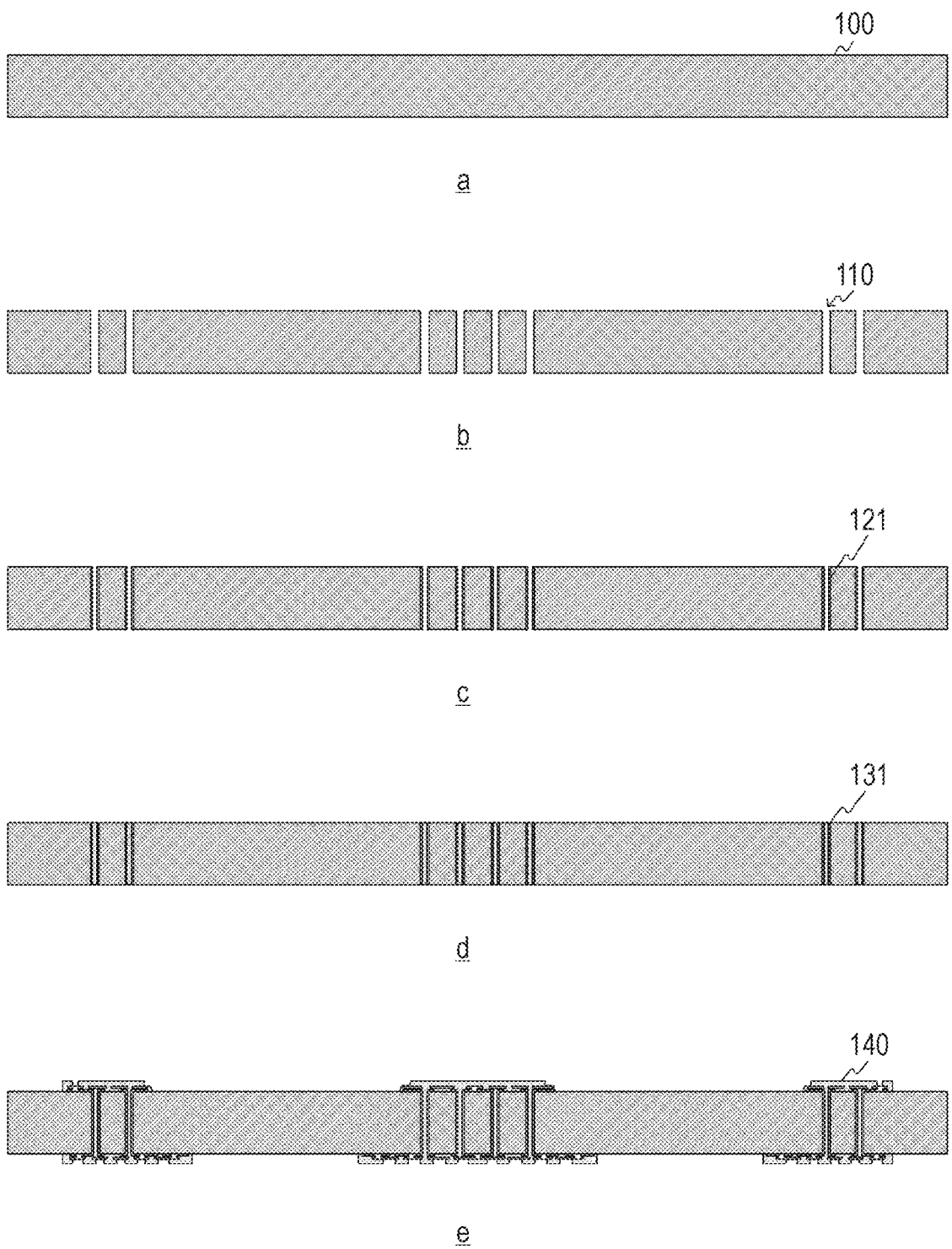
FIGS. 10A, 10B, 10C, 10D, and 10E are first diagrams showing an example of a method for manufacturing the semiconductor device according to the sixth embodiment of the present technology.

First, as shown in Fig. 10A in the drawing, the glass substrate 100 is prepared as a base material. Then, as shown in Fig. 10B in the drawing, the through via 110 is formed. After a plating 121 such as copper is applied to the inside of the through via 110 as shown in Fig. 10C in the drawing, a metal 131 such as copper is embedded in the inside as shown in Fig. 10D in the drawing, and the through electrode 120 is formed. Then, as shown in e in the drawing, the wiring layers 140 are formed on both surfaces of the glass substrate 100.

Figure 11:
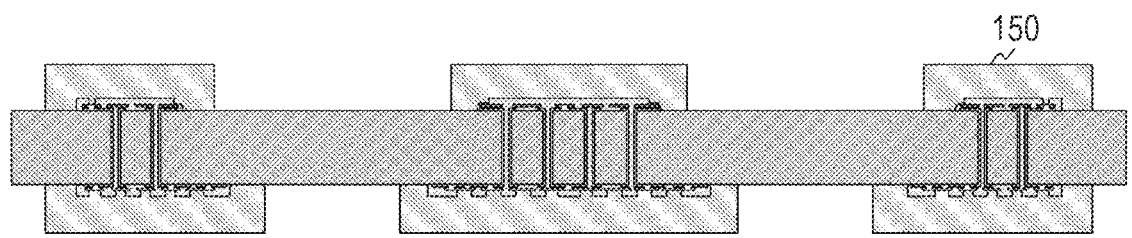
FIGS. 11A, 11B, 11C, and 11D are second diagrams showing the example of the method for manufacturing the semiconductor device according to the sixth embodiment of the present technology.
Figure 11:
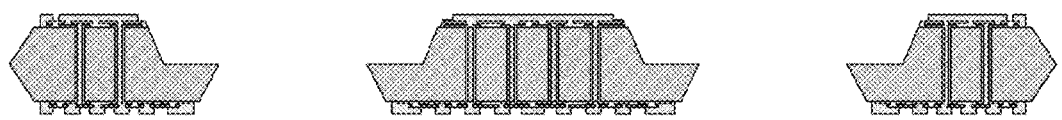
Figure 11:
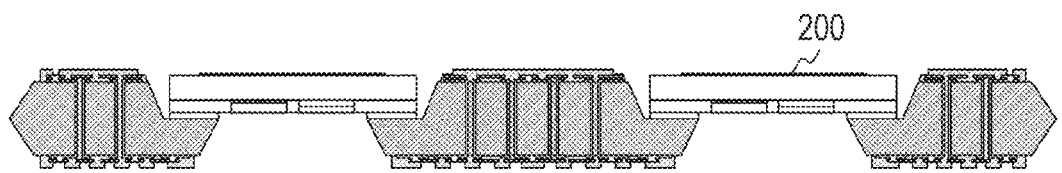
Figure 11:
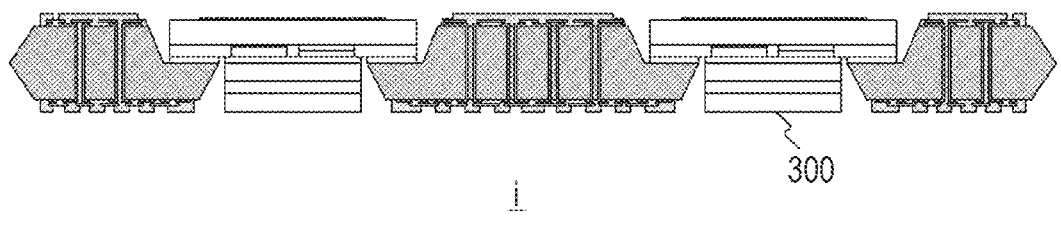

Next, as shown in Fig. 11A in the drawing, a resist 150 is patterned to protect a portion of the glass substrate 100 other than a position where the through hole is formed, and an opened portion is wet-etched. At this time, the resists 150 having different sizes are formed on both the surfaces of the glass substrate 100 in order to form the stepped portion. After the wet etching, the resists 150 are removed to obtain a cross-sectional structure as shown in Fig. 11B in the drawing.

Figure 12:
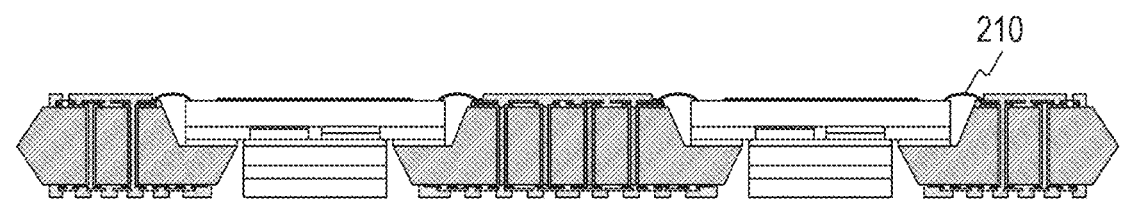
FIGS. 12A, 12B, and 12C are third diagrams showing the example of the method for manufacturing the semiconductor device according to the sixth embodiment of the present technology.
Figure 12:
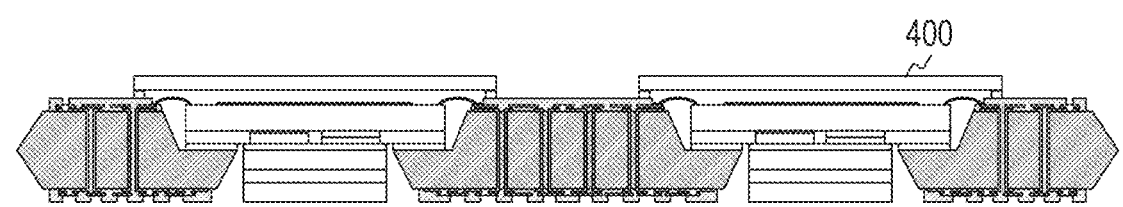
Figure 12:
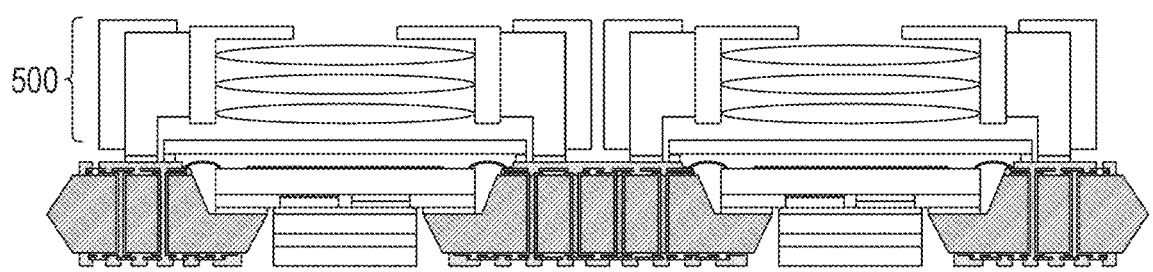

Next, as shown in Fig. 11C in the drawing, the image sensor package 200 is brought into contact with and joined to the stepped portion of the glass substrate 100. Then, as shown in Fig. 11D in the drawing, the heat dissipation member 300 is joined to the surface opposite to the light receiving surface of the image sensor package 200. As shown in Fig. 12A in the drawing, bonding by the bonding wire 210 is formed between the pad of the wiring layer 140 of the glass substrate 100 and the image sensor package 200.

Next, as shown in Fig. 12B in the drawing, the lid 400 is formed on the light receiving surface side of the image sensor package 200. Then, as shown in Fig. 12C in the drawing, the lens structure 500 is formed so as to cover the lid 400.

Note that this manufacturing method can be similarly applied to the other embodiments described above. Furthermore, since the compound-eye mounting structure as in the sixth embodiment is assumed in this example, an example in which the lid 400 and the lens structure 500 are mounted before dicing is shown. However, these may be mounted after the dicing.

As described above, according to the sixth embodiment of the present technology, by using the glass substrate 100, an initial warp and tilt and a warp and tilt due to a difference in coefficient of linear expansion can be reduced while mounting two or more image sensor packages 200.

Note that the above-described embodiments show examples for embodying the present technology, and the matters in the embodiments and the matters specifying the invention in the claims have a corresponding relationship with each other. Similarly, the matters specifying the invention in the claims and the matters in the embodiments of the present technology having the same name have a corresponding relationship with each other. However, the present technology is not limited to the embodiments, and can be embodied by applying various modifications to the embodiments without departing from the gist thereof.

Note that the effects described in the present specification are merely examples and are not limited, and furthermore, there may be other effects.

Note that the present technology can have the following configurations.

(1) A semiconductor device including:

a glass substrate having a through hole penetrating front and back surfaces and a stepped portion on an outer periphery of the through hole; and a semiconductor element joined to the stepped portion.

(2) The semiconductor device according to (1) above, in which the glass substrate includes a wiring layer on its surface.

(3) The semiconductor device according to (2) above, in which the semiconductor element is disposed at a position where its surface is substantially on the same plane as the wiring layer.

(4) The semiconductor device according to (1) above, in which the stepped portion includes a first stepped portion provided on the outer periphery of the through hole and a second stepped portion provided on an outer periphery of the first stepped portion, and the semiconductor element is joined to the first stepped portion.

(5) The semiconductor device according to (4) above, in which the glass substrate includes a wiring layer on each of its surface and the second stepped portion.

(6) The semiconductor device according to (5) above, in which the semiconductor element is disposed at a position where its surface is substantially on the same plane as the wiring layer on a bottom surface of the second stepped portion.

(7) The semiconductor device according to any one of (1) to (6) above, in which the semiconductor element is an imaging element.

(8) The semiconductor device according to (7) above, in which the semiconductor element is joined to the glass substrate on a surface on a side opposite to a light receiving portion of the imaging element.

(9) The semiconductor device according to (7) above, in which the semiconductor element is joined to the glass substrate on an outer periphery of a light receiving portion of the imaging element.

(10) The semiconductor device according to any one of (1) to (9) above, further including:

a heat dissipation member to be joined to the semiconductor element.

(11) The semiconductor device according to (10) above, in which the heat dissipation member is further joined to the glass substrate.

(12) The semiconductor device according to (10) or (11) above, in which the heat dissipation member is a flexible heat dissipation sheet.

(13) The semiconductor device according to (10) above, in which the heat dissipation member is a clad material.

(14) The semiconductor device according to any one of (1) to (13) above, in which in the glass substrate, a side surface of an opening in the through hole is tapered.

(15) The semiconductor device according to any one of (1) to (13) above, in which in the glass substrate, a side surface of an opening in the through hole is substantially perpendicular to the surface of the glass substrate.

(16) The semiconductor device according to any one of (1) to (15) above, in which the glass substrate includes at least two base materials joined to each other.

(17) The semiconductor device according to any one of (1) to (16) above, further including: a resin having a light shielding property that covers the side surface of the opening in the through hole of the glass substrate.

(18) The semiconductor device according to (7) above, further including:

a lens structure in which a plurality of lenses is laminated, in which light focused by the plurality of lenses is incident on the imaging element.

(19) The semiconductor device according to any one of (1) to (18) above, in which the glass substrate includes a plurality of the through holes, and a plurality of the semiconductor elements joined to the stepped portion of each of the plurality of through holes is provided.

REFERENCE SIGNS LIST 11, 12 Imaging device
100 to 102 Glass substrate
110 Through via
120 Through electrode
121 Plating
131 Metal
140 Wiring layer
150 to 152 Resist
160 Through electrode
191, 192 Stepped portion
193 Through hole
200 Image sensor package
210 Bonding wire
220 Light shielding resin
230 Dam material
300, 310, 320 Heat dissipation member
400 Lid
410 Light shielding film
500 Lens structure

The invention claimed is:

1. A semiconductor device, comprising:
a glass substrate, wherein the glass substrate includes:
a through hole penetrating a front surface of the glass substrate and a back surface of the glass substrate,
a stepped portion on an outer periphery of the through hole, and
a wiring layer on each of the front surface and the back surface of the glass substrate; and
a semiconductor element joined to the stepped portion, wherein the semiconductor element is at a position where a surface of the semiconductor element is substantially on a same plane as the wiring layer.

2. The semiconductor device according to claim 1, wherein
the stepped portion includes a first stepped portion on the outer periphery of the through hole and a second stepped portion on an outer periphery of the first stepped portion, and
the semiconductor element is joined to the first stepped portion.

3. The semiconductor device according to claim 2, wherein the glass substrate further includes the wiring layer on the second stepped portion.

4. The semiconductor device according to claim 3, wherein the semiconductor element is at a position where a surface of the semiconductor element is substantially on a same plane as the wiring layer on a bottom surface of the second stepped portion.

5. The semiconductor device according to claim 1, wherein the semiconductor element is an imaging element.

6. The semiconductor device according to claim 5, wherein the semiconductor element is joined to the glass substrate on a surface on a side opposite to a light receiving portion of the imaging element.

7. The semiconductor device according to claim 5, wherein the semiconductor element is joined to the glass substrate on an outer periphery of a light receiving portion of the imaging element.

8. The semiconductor device according to claim 1, further comprising
a heat dissipation member joined to the semiconductor element.

9. The semiconductor device according to claim 8, wherein the heat dissipation member is further joined to the glass substrate.

10. The semiconductor device according to claim 8, wherein the heat dissipation member is a flexible heat dissipation sheet.

11. The semiconductor device according to claim 8, wherein the heat dissipation member is a clad material.

12. The semiconductor device according to claim 1, wherein
in the glass substrate, a side surface of an opening in the through hole is tapered.

13. The semiconductor device according to claim 1, wherein
in the glass substrate, a side surface of an opening in the through hole is substantially perpendicular to the front surface and the back surface of the glass substrate.

14. The semiconductor device according to claim 1, wherein
the glass substrate includes at least two base materials,
the at least two base materials include a first base material and a second base material, and the first base material is joined to the second base material.

15. The semiconductor device according to claim 12, further comprising
a resin configured to cover the side surface of the opening in the through hole of the glass substrate.

16. The semiconductor device according to claim 5, further comprising
a lens structure that includes a plurality of lenses, wherein
the plurality of lenses is laminated in the lens structure, and
the plurality of lenses is configured to focus light on the imaging element.

17. The semiconductor device according to claim 1, wherein
the glass substrate includes a plurality of through holes,
the plurality of through holes includes the through hole,
the semiconductor device further comprises a plurality of semiconductor elements,
the plurality of semiconductor elements includes the semiconductor element, and
each semiconductor element of the plurality of semiconductor elements is joined to the stepped portion of a corresponding through hole of the plurality of through holes.

* * * * *